(12) United States Patent
Watts

(10) Patent No.: US 10,361,228 B2
(45) Date of Patent: Jul. 23, 2019

(54) PROCESSING SUBSTRATES USING A TEMPORARY CARRIER

(71) Applicant: FLEXENABLE LIMITED, Cambridge (GB)

(72) Inventor: James Denziel Watts, Hook Norton (GB)

(73) Assignee: FLEXENABLE LIMITED, Cambridge (GB)

( * ) Notice: Subject to any disclaimer, the term of this patent is extended or adjusted under 35 U.S.C. 154(b) by 591 days.

(21) Appl. No.: 14/881,773

(22) Filed: Oct. 13, 2015

(65) Prior Publication Data
US 2016/0035764 A1 Feb. 4, 2016

Related U.S. Application Data

(63) Continuation of application No. 13/701,744, filed as application No. PCT/EP2011/059220 on Jun. 3, 2011, now abandoned.

(30) Foreign Application Priority Data

Jun. 4, 2010 (GB) .................................. 1009401.9

(51) Int. Cl.
B32B 7/06 (2019.01)
B32B 37/12 (2006.01)
(Continued)

(52) U.S. Cl.
CPC .......... H01L 27/1266 (2013.01); H01L 21/02 (2013.01); H01L 21/68 (2013.01);
(Continued)

(58) Field of Classification Search
CPC ......... H01L 21/6835; H01L 2221/6835; H01L 2221/68381; H01L 27/1266;
(Continued)

(56) References Cited

U.S. PATENT DOCUMENTS 4,941,255 A * 7/1990 Bull .................... H01L 21/6835
156/235
2004/0038469 A1 2/2004 Yamanoto
(Continued)

FOREIGN PATENT DOCUMENTS

EP 1 464 688 A1 10/2004
EP 2 315 500 A1 4/2011
(Continued)

OTHER PUBLICATIONS

English translation of ISR of PCT/EP2011/059220.*
(Continued)

Primary Examiner — Sonya M Sengupta
(74) Attorney, Agent, or Firm — Sughrue Mion, PLLC

(57) ABSTRACT

A technique comprising: securing a device substrate (8) to a carrier (1) using one or more adhesive elements (6); forming electronic elements (10) on the device substrate with the device substrate thus secured to the carrier; and thereafter reducing the adhesion strength of at least one of the one or more adhesive elements to facilitate the release of the substrate from the carrier.

13 Claims, 3 Drawing Sheets

(51) Int. Cl.
*H01L 21/02* (2006.01)
*H01L 21/20* (2006.01)
*H01L 21/50* (2006.01)
*H01L 21/67* (2006.01)
*H01L 21/68* (2006.01)
*H01L 21/70* (2006.01)
*H01L 21/78* (2006.01)
*H01L 23/12* (2006.01)
*H01L 23/32* (2006.01)
*H01L 21/304* (2006.01)
*H01L 27/12* (2006.01)
*H05K 13/00* (2006.01)
*H01L 21/683* (2006.01)
*H01L 29/786* (2006.01)

(52) U.S. Cl.
CPC .... *H01L 21/6835* (2013.01); *H01L 29/78603* (2013.01); *H05K 13/00* (2013.01); *B32B 7/06* (2013.01); *B32B 37/12* (2013.01); *B32B 2307/748* (2013.01); *B32B 2309/02* (2013.01); *H01L 21/20* (2013.01); *H01L 21/304* (2013.01); *H01L 21/50* (2013.01); *H01L 21/67* (2013.01); *H01L 21/70* (2013.01); *H01L 21/78* (2013.01); *H01L 23/12* (2013.01); *H01L 23/32* (2013.01); *H01L 2221/6835* (2013.01); *H01L 2221/68381* (2013.01)

(58) Field of Classification Search
CPC ... H01L 29/78603; H05K 13/00; B32B 37/12; B32B 7/06; B32B 2307/748; B32B 2309/02
USPC .......................... 438/34; 156/289, 247, 767
See application file for complete search history.

(56) References Cited

U.S. PATENT DOCUMENTS

| | | |
|---|---|---|
| 2007/0076348 A1 | 4/2007 | Shioga et al. |
| 2010/0297829 A1 | 11/2010 | O'Rourke |
| 2013/0255873 A1* | 10/2013 | Watts ................. H01L 21/6835 156/247 |

FOREIGN PATENT DOCUMENTS

| | | | |
|---|---|---|---|
| WO | 2008/005979 A1 | 1/2008 | |
| WO | 2010/004703 A1 | 1/2010 | |
| WO | WO-2011151457 A1 * | 12/2011 | ......... H01L 21/6835 |

OTHER PUBLICATIONS

English translation of Written Opinion of PCT/EP2011/059220.*
English translation of EP1464688.*
International Search Report of PCT/EP2011/059220 dated Oct. 9, 2011.
British Search Report of GB 1009401.9 dated Oct. 11, 2011.
Written Opinion of the ISA for PCT/EP2011/059220.

* cited by examiner

PROCESSING SUBSTRATES USING A TEMPORARY CARRIER

CROSS REFERENCE TO RELATED APPLICATIONS

This is a Continuation of application Ser. No. 13/701,744 filed Feb. 15, 2013, claiming priority based on International Application No. PCT/EP2011/059220 filed Jun. 3, 2011, claiming priority based on British Patent Application No. 1009401.9, filed Jun. 4, 2010, the contents of all of which are incorporated herein by reference in their entirety.

The present invention relates to a method of processing substrates. In one embodiment, it relates to a method of processing flexible substrates in the production of flexible electronic devices.

Some electronic devices such as flexible displays use flexible polymer substrates as the support for electronic elements such as an array of TFTs.

One challenge with the production of such devices is to prevent misalignment of electronic elements caused by distortion of the substrate during processing. One technique aimed at reducing such misalignments is to subject the plastic (polymer) substrate to a prolonged bake before processing.

It is an aim of the present invention to provide an improved technique for reducing such misalignments.

The present invention provides a method, comprising: securing a device substrate to a carrier using one or more adhesive elements; forming electronic elements on the device substrate with the device substrate thus secured to the carrier; and thereafter reducing the adhesion strength of at least one of the one or more adhesive elements to facilitate the release of the substrate from the carrier.

In one embodiment, the method further comprises: securing a substrate to a carrier using one or more adhesive elements; processing the substrate with the substrate thus secured to the carrier; and thereafter reducing the adhesion strength of at least one of the one or more adhesive elements to facilitate the release of the substrate from the carrier, wherein the substrate is secured to the carrier using an adhesive unit comprising adhesive layers supported on opposite sides of a support element; and comprising preferentially reducing the adhesion strength of the adhesive layer between the support element and one of the substrate and carrier, and removing said one of the substrate and carrier from the adhesive unit without removing the other of the substrate and the carrier from the adhesive unit.

In one embodiment, the method further comprises: preferentially reducing the adhesion strength of the adhesive layer between the support element and the substrate, and removing the substrate from the adhesive unit without removing the adhesive unit from the carrier.

In one embodiment, the method further comprises: thereafter reducing the adhesion strength of the adhesive layer between the support element and the carrier, and removing the adhesive unit from the carrier.

In one embodiment, the method further comprises: reducing the adhesion strength of the adhesive layer between the support element and said one of the substrate and the carrier by heating the adhesive unit to a first temperature, and reducing the adhesion strength of the adhesive layer between the support element and the other of the substrate and the carrier by heating the adhesive unit to a second temperature higher than the first temperature.

In one embodiment, the second temperature is higher than the first temperature by at least about 20 degrees C.

In one embodiment, the second temperature is higher than the first temperature by at least about 40 degrees C.

In one embodiment, the first temperature is in the range of 85 to 95 degrees C.

In one embodiment, the second temperature is in the range of 130 to 170 degrees C.

In one embodiment, the adhesive layers exhibit an adhesion strength of at least 3 Newtons/20 mm before the heating.

In one embodiment, processing the substrate comprises forming one or more electronic elements on the device substrate.

In one embodiment, the method further comprises: reducing the adhesion strength of at least one of the adhesive elements or at least one of the adhesive layers by heating or by irradiation.

In one embodiment, the substrate or device substrate is a flexible substrate, and the carrier is a glass carrier.

In one embodiment, the substrate or device substrate exhibits a co-efficient of thermal expansion of greater than about 10 ppm of expansion per degree C.

In one embodiment, the substrate or device substrate is more flexible than the carrier.

In one embodiment, the substrate or device substrate has a co-efficient of thermal expansion greater than that of the carrier.

In one embodiment, the substrate or device substrate is secured to the carrier as part of a sheet of substrate or device substrate material providing a plurality of substrates or device substrates.

According to one embodiment, a dual adhesive element is provided that is able to adhere the substrate to the carrier during processing of the device, but then is able to release the substrate from the carrier when required, during a single step, while avoiding both distortion and damage to the substrate during processing, and further allows the carrier to be reused.

According to one embodiment, the tackiness of an upper adhesive layer is able to be reduced when required, allowing the substrate to be released from the carrier, without any effects of degradation to the substrate. The dual adhesive element remains on the carrier, until a further increase in temperature is used to reduce the tackiness of a lower adhesive layer of the dual adhesive element and facilitate the release of the dual adhesive element from the carrier.

A specific embodiment thereof will now be described by way of example and with reference to the accompanying drawings, in which.

Figure 1:
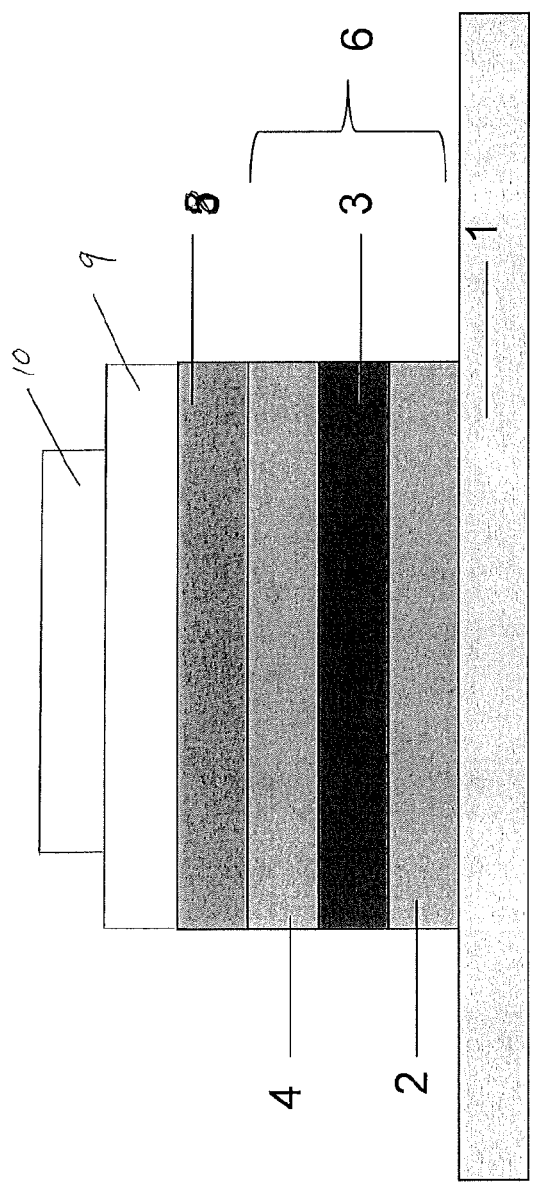
FIG. 1 illustrates the securing a device substrate to a carrier in accordance with an embodiment of the present invention using an adhesive element.

In accordance with a first embodiment of the invention as illustrated in FIG. 1, a plurality of flexible device substrates 8 (only one is shown in FIG. 1) are secured to a rigid glass carrier 1 via an adhesive element 6. As discussed in more detail below, the electronic elements 10 (such as the TFT array) are formed on the device substrate 8 after the device substrate 8 has been secured to the rigid glass carrier 1. After processing, the device substrate 8 is removed from the carrier 1. The electronic elements 10 are formed on the device substrate 8 via a planarisation layer 9 deposited on the device substrate 8 after securing the device substrate 10 to the carrier 1.

The processing of the device substrate includes a sequence of steps including depositing material and removing deposited material. Such deposition and removal steps are controlled automatically on the basis of the expected position and configuration of the device substrate 8 on the carrier 1. If the position of the device substrate 8 relative to the carrier 1 and/or the configuration of the device substrate 8 on the carrier 1 does not remain substantially constant for each of the sequence of steps, this can lead to misalignments and device failures.

The device substrate 8 may be a flexible substrate, such as an organic polymer substrate, for supporting a TFT array 10 to serve as the backplane of an LCD or electrophoretic display device. Examples of plastic substrates for this use are organic polymer films such as films of heat-stabilised polyethyleneterephtalate (HS-PET) and films of heat-stabilised polyethylenenaphtalene (HS-PEN).

The adhesive element 6 comprises a central polyester film support element 3 supporting two adhesive layers 2, 4. For the adhesive layers 2 and 4 are used materials whose strength of adhesion for the carrier 1 and device substrate 8 can be reduced by an external stimulus such as heating or UV irradiation. Under the conditions at which the device substrate is processed in position on the carrier, the adhesive layers exhibit an adhesion strength sufficiently high to securely hold the device substrate 8 on the carrier during the processing of the substrate on the carrier.

The processing of the device substrate includes exposing the device substrate to low pressure/vacuum conditions as part of the production of the TFT array 10, and the adhesion strength exhibited by the adhesive layers for the carrier, support element and device substrate is sufficiently high to prevent the device substrate 8 from bubbling up (lifting) under such low pressure/vacuum conditions. Bubbling-up of the substrate is undesirable because it can cause distortion in the z-axis (i.e. an axis perpendicular to the plane of the device substrate) during processing, and can also cause distortion in the x-y axis (i.e. in a direction parallel to the plane of the device substrate 8) after a return to normal pressure conditions, as the device substrate relaxes back down.

The processing of the device substrate 8 on the carrier also includes subjecting the device substrate to rises in temperature. Flexible plastic substrates have a relatively high co-efficient of thermal expansion (CTE), and rises in temperature during processing cause expansion of the device substrate. The internal cohesive strength of the adhesive layers (and also the other layers/elements in the stack) are sufficiently high to return the device substrate 8 to substantially the same X-Y position relative to the glass carrier upon a return to normal temperature conditions in preparation for another processing step. This further helps to reduce or eliminate the misalignment of layers/elements/components applied to or deposited on the device substrate 8 as part of said another processing step.

After processing of the device substrate 8 on the carrier 1 is completed, the adhesive element 6 is subjected to the necessary external stimulus to trigger a reduction in the adhesion strength of the adhesive layers.

In accordance with this embodiment of the invention, the adhesive materials for the two adhesive layers 2 and 4 are selected such that a significant reduction in the adhesion strength can be triggered in the adhesive layer 4 adjacent to the device substrate 8 without triggering a significant reduction in the adhesion strength of the adhesive layer 2 adjacent to the carrier 1. It is found that this is advantageous for ensuring complete and reliable removal of adhesive material from the undersurface of the device substrate 8.

Further in accordance with this embodiment of the invention, the adhesive material for the adhesive layer 2 adjacent to carrier 1 is further selected such that its adhesion strength can be significantly reduced by the application of a further external stimulus. For example, the adhesive material for the adhesive layer 4 adjacent to the device substrate 8 is one at which a significant reduction in adhesion strength is first achieved in a short period (e.g. 3 seconds) at a relatively low temperature (e.g. between 85 and 95 degrees C. or about 90 degrees C.), and the adhesive material for the adhesive layer 2 adjacent to the carrier 1 is one at which a significant reduction in adhesion strength is first achieved in a short period (e.g. 3 seconds) at a higher temperature (e.g. between 130 and 170 degrees C. or about 150 degrees C.).

The selection of appropriate trigger temperatures will depend on the temperatures that are reached during the processing of the device substrate 8 on the carrier 1, and the amount of heat that the device substrate 8 and the TFT array 7 formed thereon can withstand without suffering a degradation of those elements and a deterioration in device performance. It has been found that a temperature of between 85 to 95 degrees C. or about 90 degrees C. is a suitable trigger temperature for the adhesive layer 4 adjacent to the device substrate 8 for the case of a TFT array including organic polymer materials for the semiconducting channel and gate dielectric. An appropriate trigger temperature for the adhesive layer 2 adjacent to the carrier 1 is the lowest temperature at which it can be sure that the adhesive layer 2 adjacent to the carrier 1 will not undergo a significant degree in adhesion strength at the time of heating the adhesive layer 4 adjacent to the device substrate 8 to trigger a reduction in the adhesion strength of that adhesive layer. It has been found that a temperature of between 130 and 170 degrees C. or about 150 degrees C. is a suitable trigger temperature for the adhesive layer 2 adjacent to the carrier 1. In order to prevent a significant reduction in the adhesion strength of the adhesive layer adjacent to the carrier 1 at the time of reducing the strength of the adhesive layer adjacent to the device substrate 8, the trigger temperature for the adhesive layer adjacent to the carrier 1 should be sufficiently higher than the trigger temperature for the adhesive layer adjacent to the device substrate 8. A trigger temperature difference of least about 20 degrees C., and more preferably at least about 40 degrees C. is found to be effective for this purpose.

It has been found that this embodiment of the present invention can be implemented by making the adhesive element using, for example, adhesive tapes commercially available from Nitto Denko under the product name REVALPHA®. These tapes are found to exhibit an adhesion strength of at least 3N/20 mm (as measured in accordance with the JIS Z-0237 standard (Surface material: S/S board, Peeling speed: 300 mm/min, Peeling angle: 180° ) for the glass carrier 1 and a PET device substrate 8 at the temperatures under processing of the device substrate 8 to form the TFT array 10 takes place. This level of adhesion strength is found to be sufficient to reliably hold the device substrate 8 in place on the carrier 1 and substantially prevent distortions of the kind that might cause misalignments of the various elements deposited on the device substrate 8 to form the TFT array 10. These tapes are available in different types exhibiting a reduction in adhesion strength at different temperatures. It has been found that the 90 degree C. type is suitable for the adhesive layer 4 adjacent to the device substrate 8 and that the 150 degree C. type is suitable for the adhesive layer 2 adjacent to the carrier 1.

Figure 2:
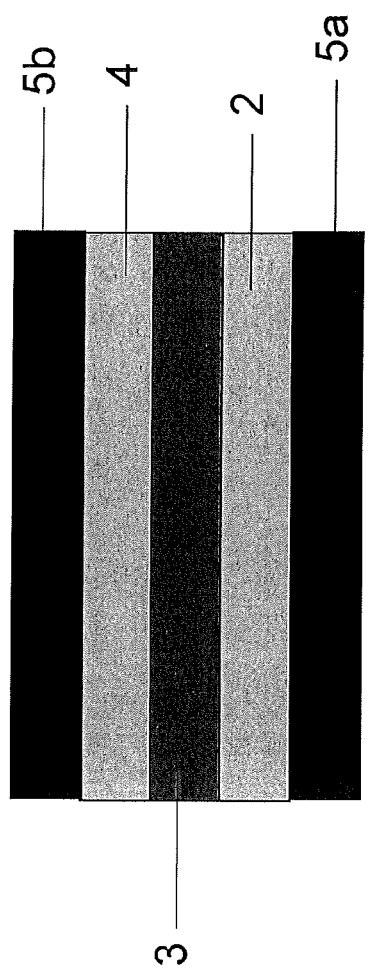
FIG. 2 illustrates pre-use protection of the adhesive element used in FIG. 1.

As shown in FIG. 2, the tapes are provided with upper and lower liners 5a, 5b that provide pre-use protection for the adhesives layer 2 and 4. These liners 5a, 5b are removed from the adhesive element 6 before the adhesive element 6 is used to secure the device substrate 8 to the carrier 1.

To secure the device substrate 8 to the carrier 1: firstly, the lower liner (5a) is first removed from the adhesive element 6, and the exposed lower adhesive layer 2 is pressed onto the carrier 1 to secure the adhesive element 6 to the carrier 1; and, the upper liner 5b is then removed from the adhesive element 6, and the device substrate 8 is pressed down onto the exposed upper adhesive layer 4.

Processing of the device substrate 8 then takes place. For the example of an organic polymer TFT array, this includes the sputter deposition and patterning of upper and lower metal layers to define the source, drain and gate electrodes and addressing lines/interconnects; and the deposition from solution of an organic polymeric semiconductor material to form the semiconducting channel between the source and drain electrodes of each TFT and the deposition from solution of an organic polymeric dielectric material to form the gate dielectric between the semiconducting channel and gate electrode of each TFT.

After the processing of the device substrate on the carrier is completed (and the TFT array 10 is formed on the device substrate 8), the device substrate 8 is released from the adhesive element by mounting the rigid glass carrier 1 on a hot plate at an appropriate temperature to trigger a reduction in the adhesion strength of the adhesive layer 4 adjacent to the device substrate 8 without triggering a significant reduction in the adhesion strength of the adhesive layer 2 adjacent to the carrier 1. After removal of the device substrate 8 from the carrier 1, the carrier 1 is heated to a higher temperature to reduce the adhesion strength of the adhesive layer 2 adjacent to the carrier 1 and release the carrier 1 from the adhesive element 6, thereby facilitating reuse of the carrier 1.

The time that it takes to heat the adhesive layers to the release temperature will depend on the speed at which the heat can be transferred to the adhesive layer. Because of the thermal lag caused by the assembly in which the adhesive layers reside, it may take significantly longer to heat the adhesive layer to the respective release temperature, For example, it may take about 30 seconds, or as much as 105 seconds or 180 seconds.

According to one variation of the above-mentioned technique, adhesive materials are used for which a reduction in adhesion strength can be achieved by UV irradiation. This alternative technique is of particular use where the device substrate 8 or the TFTs 10 formed thereon are not degraded or damaged by exposure to UV radiation, and/or where the elements formed on the device substrate by processing on the carrier include heat-sensitive elements. For example, one or both of the adhesive layers 2, 4 in the technique described above could be replaced with a UV peeling tape such as those commercially available from Nitto Denko. Replacing only one of the adhesive layers 2, 4 with a UV peeling tape facilitates the selective removal of one of the carrier 1 and the device substrate 8 from the adhesive element 6. For example, if only the adhesive layer 2 adjacent to the carrier 1 is replaced with a UV peeling tape, the device substrate could be removed from the adhesive element by heating as described above, and exposure of UV irradiation from the bottom would allow the carrier 1 to be removed from the adhesive element without damage. Alternatively, a UV peeling tape could be used selectively adjacent to the device substrate 8 to facilitate removal of the device substrate 8 from the adhesive element 6 by exposure to UV radiation, and heating could be used as described above to subsequently release the adhesive element 6 from the carrier 1.

With the above-described technique, it is possible to suppress the effect of linear expansion changes in the plastic device substrate 8 during processing, as well as resist non-linear (random) distortions in the plastic device substrate 8 during processing, which non-linear distortions can arise because of defects or abnormalities in the structure of the plastic substrate. As mentioned above, the high adhesion strength and cohesive strength of the adhesive layers serve to prevent undesirable changes in the position of the device substrate 8 relative to the glass carrier 1, which itself has a very low co-efficient of thermal expansion in the range of 3 to 5 ppm expansion per degree C.

The above-described technique makes it possible to: (a) improve yields by reducing misalignments; (b) facilitate the production of high resolution displays; and (c) reduce manufacturing costs because less distortion implies less critical alignment (e.g., less local alignment steps).

We have chosen the example of producing an organic polymer TFT array to describe techniques in accordance with embodiments of the invention, but the same kind of techniques are also applicable to the production of other kinds of devices including a flexible plastic support substrate.

Figure 3:
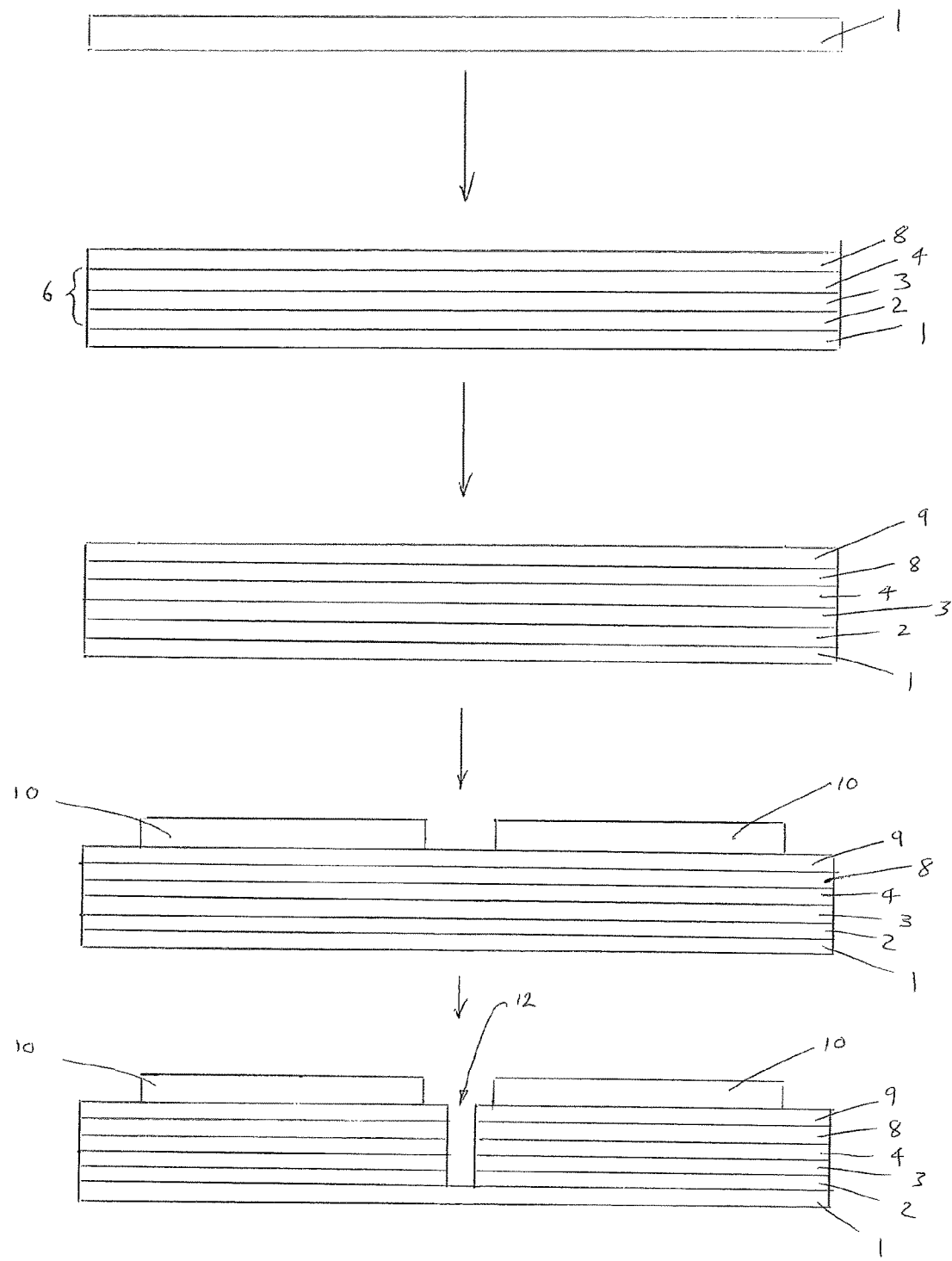
FIG. 3 illustrates securing a plurality of device substrates to a carrier in accordance with an embodiment of the present invention using an adhesive element.

Also, we have chosen to illustrate the invention in FIG. 1 with reference to the securing and processing of an individual device substrate to a rigid carrier. However, the techniques described above are equally applicable to the securing and processing of a plurality of device substrates on a common rigid carrier. For example, according to one variation illustrated in FIG. 3, the adhesive element 6 is used in the form of a relatively large area sheet to secure a sheet of device substrate material to a carrier 1. The sheet of device substrate material provides a plurality of device substrates (two are shown in FIG. 3). A planarisation layer 9 is formed over the entire surface of the device substrate material sheet 2, and then a plurality of display device products are formed on respective regions of the sheet of device substrate material 2. After the processing is completed, the device substrate material sheet and underlying adhesive element sheet 6 is cut in a region between the device substrate regions, and the plurality of individual device substrates are removed from the respective adhesive element patches in the same way as described above in relation to FIG. 1; and the adhesive element patches left adhered to the carrier 1 are also removed from the carrier in the same way as described above in relation to FIG. 1.

The invention is not limited to the above-described examples and embodiments. It will be evident to a person skilled in the art that various modifications may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A method, comprising:
   securing a substrate to a carrier using one or more adhesive elements, wherein the device substrate exhibits a thermal co-efficient of expansion greater than that of the carrier;
   forming electronic elements on the substrate with the substrate thus secured to the carrier,
      wherein said forming electronic elements comprises controlling deposition of material and removal of deposited material on the basis of an expected position of the device substrate relative to the carrier,
      wherein said forming electronic elements further comprises subjecting the device substrate to one or more temperature rises causing expansion of the device substrate, and
      wherein the one or more adhesive elements have an internal cohesive strength sufficiently high to return the device substrate to a same position on the carrier upon reversal of the one or more temperature rises;
   thereafter reducing the adhesion strength of at least one of the one or more adhesive elements to facilitate the release of the substrate from the carrier.

2. The method according to claim 1, comprising: reducing the adhesion strength of at least one of the adhesive elements by heating.

3. The method according to claim 1, wherein the substrate or device substrate is a flexible substrate, and the carrier is a glass carrier.

4. The method according to claim 1, wherein the substrate or device substrate exhibits a co-efficient of thermal expansion of greater than about 10 ppm of expansion per degree C.

5. The method according to claim 1, wherein the substrate or device substrate is more flexible than the carrier.

6. The method according to claim 1, wherein the substrate or device substrate is secured to the carrier, as part of a sheet of substrate or device substrate material, providing a plurality of substrates or device substrates.

7. The method according to claim 1, comprising: reducing the adhesion strength of at least one of the adhesive elements by irradiation.

8. The method according to claim 1, wherein the substrate comprises an organic polymer substrate.

9. The method according to claim 1, wherein the substrate comprises a flexible plastic substrate.

10. The method according to claim 1, wherein forming electronic elements on the substrate comprises: sputter deposition and patterning of one or more metal layers.

11. The method according to claim 1, wherein forming electronic elements on the substrate comprises depositing one or more materials from solution.

12. The method according to claim 1, wherein forming electronic elements on the substrate comprises: defining source, drain and gate electrodes of a TFT array; forming semiconducting channels of the TFT array; and forming the gate dielectric of the TFT array.

13. The method according to claim 1, wherein forming electronic elements on the substrate comprises: preventing the substrate from bubbling-up under low pressure/vacuum conditions.

* * * * *